(12) United States Patent
Yee et al.

(10) Patent No.: US 7,436,233 B2
(45) Date of Patent: Oct. 14, 2008

(54) NORMAL MODE AND GREEN MODE PULSE WIDTH MODULATION CONTROLLER

(75) Inventors: Hsian-Pei Yee, Taipei (TW); Tung Sheng Chang, Taipei (TW)

(73) Assignee: SYNC Power Corp., Taipei (TW)

( * ) Notice: Subject to any disclaimer, the term of this patent is extended or adjusted under 35 U.S.C. 154(b) by 80 days.

(21) Appl. No.: 11/555,426

(22) Filed: Nov. 1, 2006

(65) Prior Publication Data

US 2008/0100361 A1    May 1, 2008

(51) Int. Cl.
 *H03K 3/17* (2006.01)
(52) U.S. Cl. .................. 327/172; 327/175; 327/26; 327/37; 323/282; 323/284
(58) Field of Classification Search .................. None
See application file for complete search history.

(56) References Cited

U.S. PATENT DOCUMENTS 6,713,995 B2* 3/2004 Chen ..................... 323/284
6,798,180 B2* 9/2004 Sase et al. ................ 323/282
7,109,692 B1* 9/2006 Wu et al. .................. 323/282

* cited by examiner

*Primary Examiner*—An T Luu
(74) *Attorney, Agent, or Firm*—Ming Chow; Sinorica, LLC

(57) ABSTRACT

A PWM controller that effectively transitions between normal mode and green power mode is disclosed. A driver provides a normal drive signal during normal operation. A pulse width detector detects the pulse width of the PWM signal and if the pulse width drops below a threshold the normal mode drive signal will be turned off and a pulse ON time measurer will begin storing the pulse ON time. When the total ON time reaches a total ON time threshold or the output voltage drops below a voltage limit, a green mode drive signal will be output to the power converter. During green mode the driver will continue sending the green mode drive signal at intervals until a heavy load condition when the green mode drive signal will be shut off and the driver will resume sending the normal mode drive signal.

21 Claims, 4 Drawing Sheets

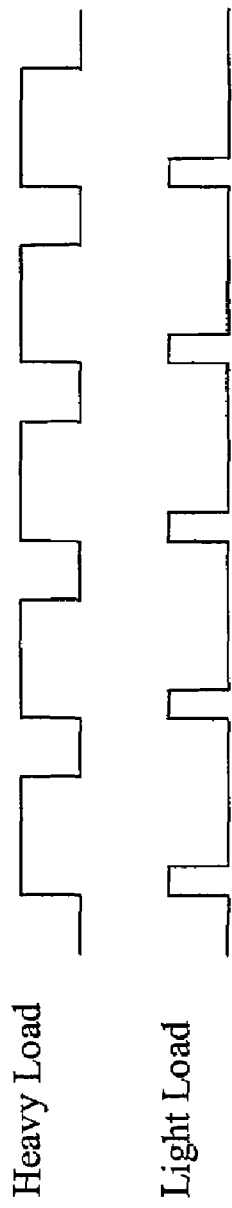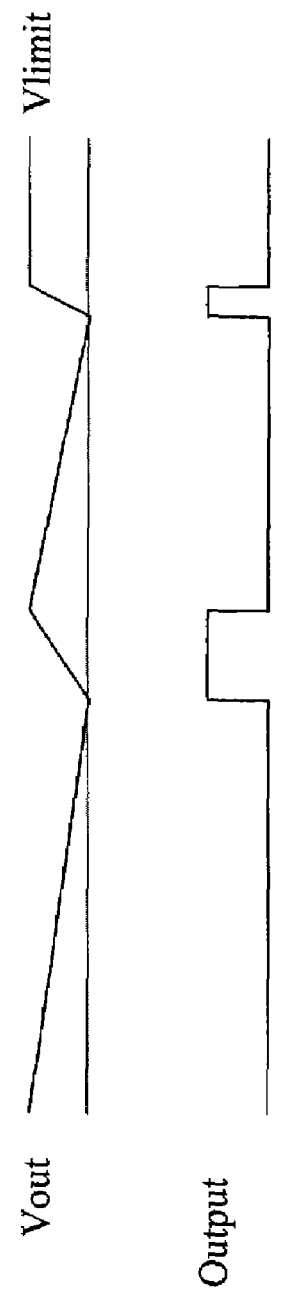
Figure 3A
Figure 3B

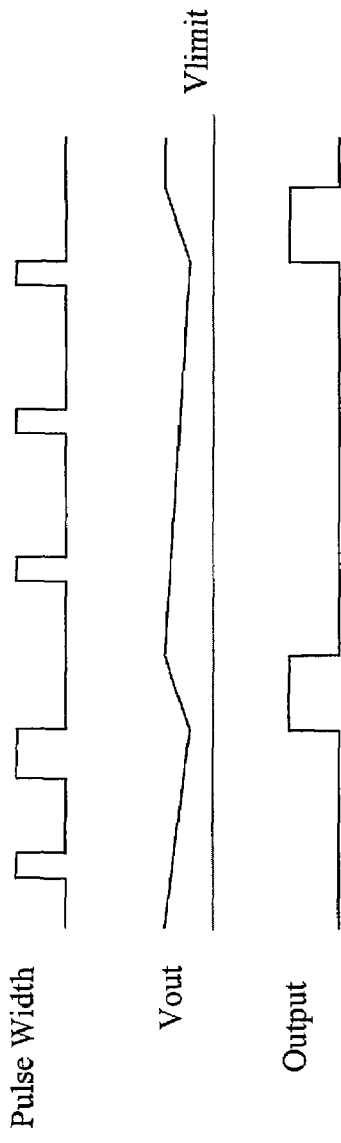
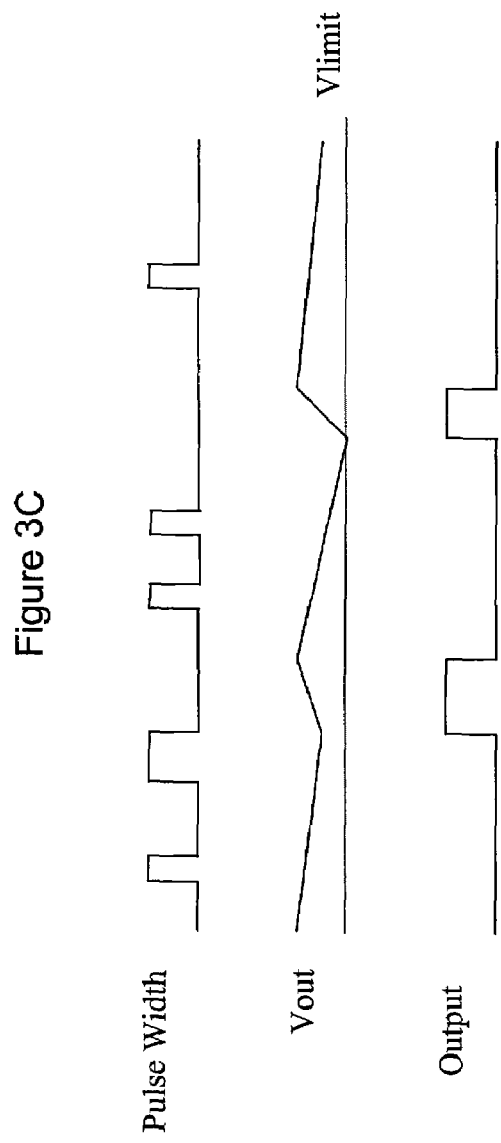
Figure 3C
Figure 3D

NORMAL MODE AND GREEN MODE PULSE WIDTH MODULATION CONTROLLER

BACKGROUND OF THE INVENTION

1. Field of the Invention

The present invention relates to power consumption reduction. More specifically, the present invention discloses an improved pulse width modulation controller with normal mode and green mode operation that increases the efficiency of the power supply and lowers power dissipation during relatively light load or no load conditions.

2. Description of the Prior Art

A main component of a switching mode power converter is the pulse width modulation controller. During normal operation, the controller drives the power converter at a fixed frequency. However, conventional power converters waste power during light load or no load conditions since the controller continues driving the power converter at the fixed frequency regardless of the load. At light load the power delivered to the load is "light" while the energy used to deliver the power remains about the same, thus its efficiency drops significantly in light or no load. In order to overcome this problem, green power supplies were created.

Green power supplies are power converters that reduce power consumption during light and standby modes. Commonly, this is achieved using burst mode operation or switching frequency reduction under light load or no load conditions.

In burst mode, the PWM driver sends a number of pulses depending on the load. For heavier loads more pulses are sent and for lighter loads fewer pulses are sent.

In a green power supply utilizing frequency change, the controller changes the switching frequency to a low value thereby reducing losses related to switching. This increases the efficiency of the power supply. With this type of controller the frequency of the drive signal changes while the ON time of the pulse remains constant, sometimes known as Constant ON control.

However, it can be difficult to design circuitry that provides smooth transitions between normal mode and green mode.

Additionally, in low power applications, the efficiency of the power supply becomes critical.

Therefore, there is need for an improved pulse width modulation controller that smoothly transitions between normal mode and green mode in order to increase the efficiency of the power supply and lowers power dissipation during light load or no load conditions.

SUMMARY OF THE INVENTION

To achieve these and other advantages and in order to overcome the disadvantages of the conventional method in accordance with the purpose of the invention as embodied and broadly described herein, the present invention provides a pulse width modulation controller with normal mode and green mode driver signals.

An objective of the present invention is to provide a pulse width modulation (PWM) controller that smoothly and effectively transitions between normal mode and green power mode. During heavy load conditions, the PWM controller emits a normal mode drive signal. As the load lightens, the PWM controller emits a drive signal with shorter and shorter ON-time. The PWM controller enters green mode when the ON time of the drive signal falls below an adjustable predetermined pulse width threshold. In this mode the controller begins storing the pulse ON times without releasing the pulses to the driver. When the stored ON time reaches an adjustable predetermined total ON time threshold, the green mode driver releases a drive signal with a pulse ON time equal to or related to the total ON time threshold. The release of the green mode drive signal also occurs when the output voltage of the converter falls below a predetermined value. The reduced switching reduces power consumption thereby improving the efficiency of the power converter while maintaining the converter output voltage within a specified range.

The PWM controller of the present invention basically comprises a pulse width detector, a pulse ON time measurer, pulse ON time releaser, and a driver. The driver provides a PWM signal to the converter during normal operation. The pulse width detector detects the pulse width of the PWM signal. When the load is being reduced into a light or no load condition, the ON time of the PWM signal will drop. If the ON time drops below an ON time threshold, the pulse width detector indicates to the pulse ON time measurer that the PWM controller is no longer in normal mode. During the time that the pulse width is below the ON time threshold, the normal drive signal will turn off (driver signals are not released) and the pulse ON time measurer will begin storing the pulse ON time.

When the total ON time of the pulse signal reaches a total ON time threshold the driver will emit (release) a pulse signal as a green mode drive signal. The ON time of the pulse signal is related to the total ON time threshold. When the driver sends the green mode drive signal the pulse ON time measurer will reset and again begin storing the pulse ON times. The controller remains in green mode until the ON time of the pulse rises back above the ON time threshold.

Typically the driver will only send a green mode drive signal every time the total ON time reaches the total ON time threshold. However, if the output voltage drops below a voltage limit, the driver will send (release) a green mode drive signal to the power converter regardless of whether the total ON time has reached the total ON time threshold. In this situation, the green mode drive signal comprises a pulse with an ON time equal to the total ON time or a ratio of the total ON time.

The driver will continue sending the green mode driver signal when the above green mode conditions are met until an increase in load beyond what is considered to be light load occurs. During such a condition, the green mode driver signal will be shut off and the driver will resume sending the normal mode driver signal.

By switching to green mode during low load or no load conditions, the PWM controller of the present invention effectively reduces power consumption. Additionally, the reduced switching reduces power loss.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 3A is a timing diagram illustrating waveforms of various signals of a PWM controller during normal mode operation according to an embodiment of the present invention; and FIGS. 3B-3D are timing diagrams illustrating waveforms of various signals of a PWM controller during green mode operation according to an embodiment of the present invention.

DESCRIPTION OF THE PREFERRED EMBODIMENTS

Figure 1:
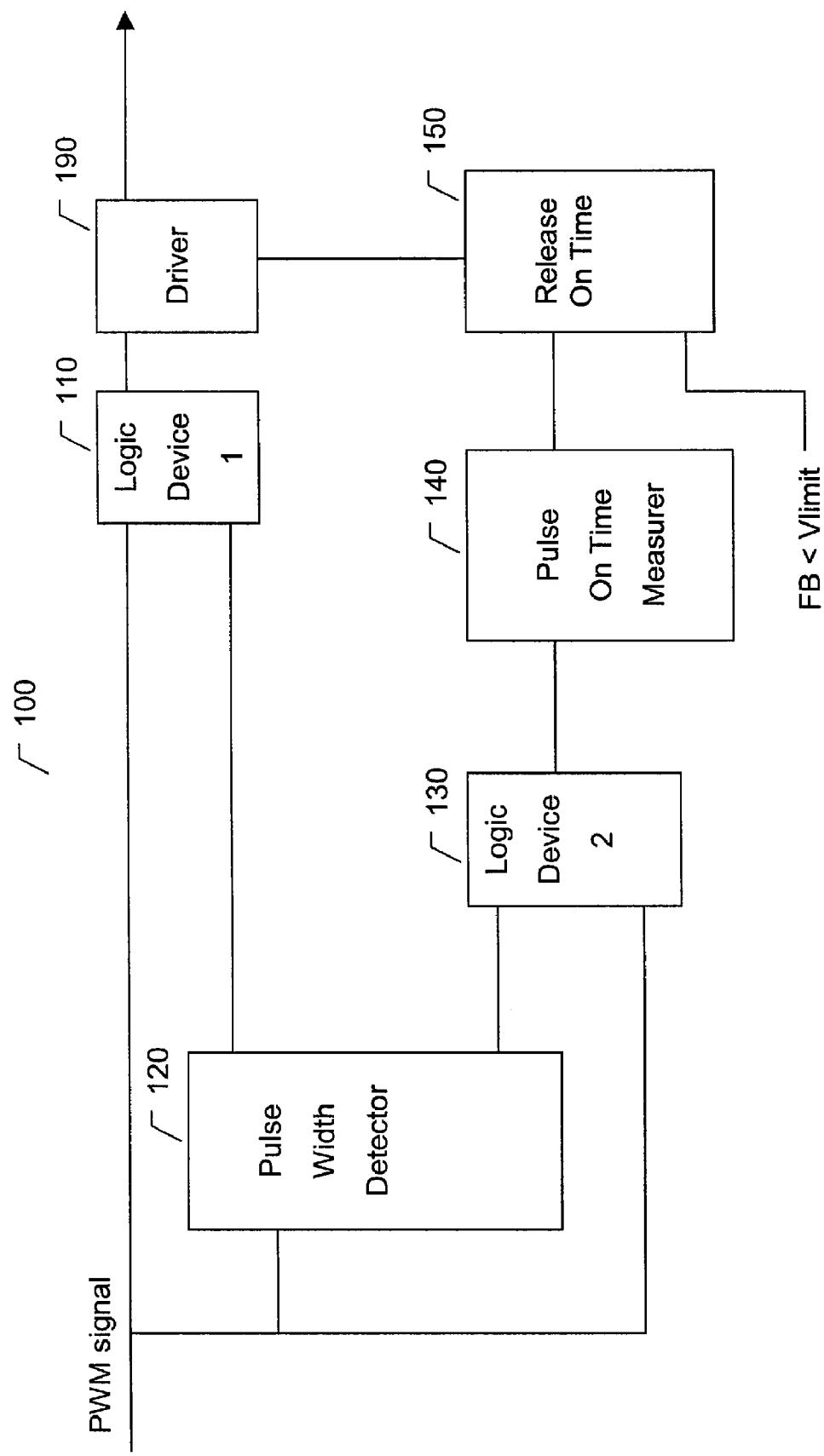
FIG. 1 is a drawing illustrating components of a PWM controller according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Refer to FIG. 1, which is a drawing illustrating the components of a PWM controller according to an embodiment of the present invention.

As shown in FIG. 1, the PWM controller 100 of the present invention basically comprises a first logic device 110, a pulse width detector 120, a second logic device 130, a pulse width ON time measurer 140, an ON time releaser 150, and a driver 190.

The first logic device 110 performs normal mode driver functions. The pulse width detector 120 detects the pulse width of a PWM signal. If the pulse width of the PWM signal is above a pulse width threshold, the pulse width detector 120 enables the first logic device 110 and the driver 190 outputs the PWM signal as a normal mode driver signal. During heavy load conditions, the pulse width or pulse ON time will be larger. As the load lightens, the pulse ON time will become shorter. If the pulse width of the PWM signal drops to below the pulse width threshold, the pulse width detector 120 disables the first logic device 110 and the driver 190 ceases outputting the normal mode driver signal.

While the pulse width is below the pulse width threshold the pulse width detector 120 enables the second logic device 130 which directs the PWM signal to the pulse width ON time measurer 140. The pulse width ON time measurer 140 begins storing the ON time of the PWM signal. When the total ON time of the PWM signal reaches a total ON time threshold, the ON time releaser 150 outputs a drive signal with a pulse width ON time in a ratio of the total ON time threshold. Additionally, if the output voltage drops below a voltage limit, the ON time releaser 150 outputs a pulse signal to the driver 190 which outputs a green mode drive signal. The pulse width of the green mode drive signal is a ratio the stored total ON time.

When the pulse width of the PWM signal rises above the pulse width threshold, the pulse width detector 120 disables the second logic device 130 and the green mode driver signal is turned off and the normal mode driver signal is enabled.

As a result, the PWM controller 100 of the present invention smoothly transitions between normal mode and green mode.

The pulse width threshold and total ON time threshold are selectable to meet system requirements.

Figure 2:
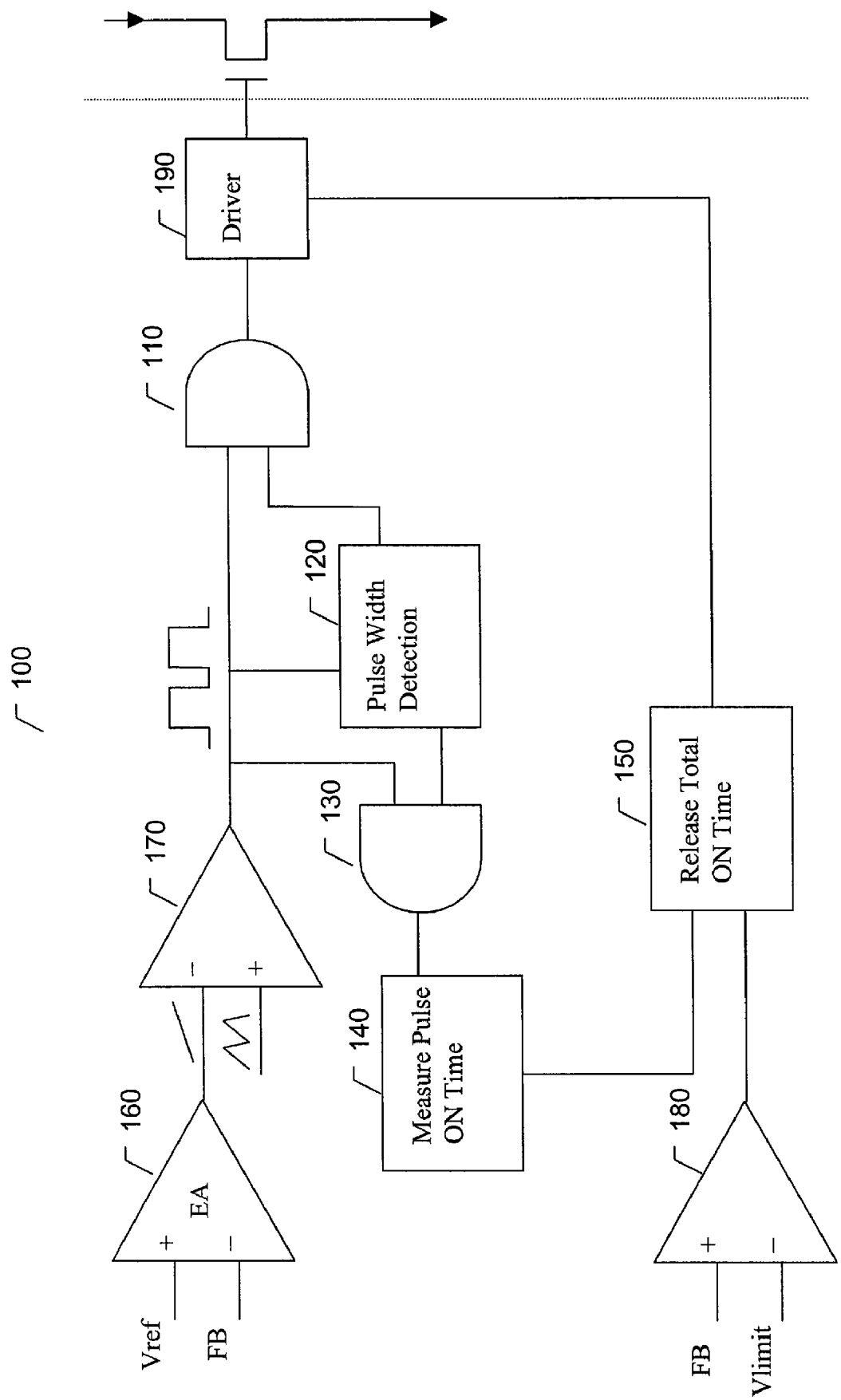
FIG. 2 is a diagram illustrating components of a PWM controller according to an embodiment of the present invention.

Refer to FIG. 2, which is a diagram illustrating components of a PWM controller according to an embodiment of the present invention.

As shown in FIG. 2, the PWM controller 100 of the present invention comprises a pulse width detector 120, a first AND gate 110, a second AND gate 130, a pulse ON time measurer 140, an ON time releaser 150, an error amplifier 160, a first comparator 170, a second comparator 180, and a driver 190.

The first AND gate 110 functions the same as the first logic device of FIG. 1.

The error amplifier comprises a positive input connected to a reference voltage Vref and a negative input connected to the output voltage for providing a feedback signal to the error amplifier 160. The output of the error amplifier 160 is connected to the negative input of the first comparator 170. A sawtooth signal is supplied to the positive input of the first comparator 170.

When the feedback signal voltage is below Vref, the error amplifier 160 outputs a ramp signal with a positive slope. When the feedback signal voltage is above Vref, the error amplifier outputs a ramp signal with a negative slope. During the time the sawtooth signal voltage is greater than the error amplifier output voltage, the first comparator outputs a logic high. During the time the sawtooth signal voltage is below the error amplifier output voltage, the first comparator outputs a logic low.

In this way, the error amplifier 160 and the first comparator 170 produce a PWM signal on the output of the first comparator 170. The output of the first comparator is connected to an input of the first AND gate 110, the second AND gate 130, and the pulse width detector 120.

The pulse width detector 120 detects the pulse width of the PWM signal. When the pulse width is above a pulse width threshold, the pulse width detector 120 outputs a logic high or one to the second input of the first AND gate 110 which enables the first AND gate to output the PWM signal to the driver 190 which outputs the signal as a normal mode driver signal. During this time, the pulse width detector 120 outputs a logic low or zero to the second input of the second AND gate 130 which holds the output of the second AND gate low and disables the pulse ON time measuring device 140.

When the pulse width is below the pulse width threshold, the pulse width detector 120 outputs a low to the first AND gate 110 which holds the output of the first AND gate low effectively disabling the first AND gate 110 and the driver 190 ceases outputting the normal mode drive signal. During this time the pulse width detector 120 outputs a high to the second AND gate 130 which enables the second AND gate 130 to supply the PWM signal to the pulse ON time measuring device 140.

At this time the pulse ON time measuring device 140 begins storing the ON times of the PWM signal. When the total ON time reaches a total ON time threshold, the ON time releaser 150 will output a pulse signal to the driver 190 which outputs the pulse as a green mode drive signal. The pulse ON time of the pulse signal is a ratio of the total ON time threshold.

Connected to a second input of the ON time releaser 150 is a second comparator 180. The positive input of the second comparator 180 is connected to the output voltage for providing a feedback signal to the second comparator 180. The negative input of the second comparator 180 is connected to a voltage limit Vlimit.

When the output voltage drops below Vlimit the ON time releaser outputs a pulse signal with a pulse ON time as a ratio of the stored total ON time. During green mode, the driver continues to output the green mode drive signal at intervals when the total ON time reaches the total ON time threshold or the output voltage drops to Vlimit.

When the pulse width detector 120 detects that the pulse width has returned to above the pulse width threshold, the pulse width detector 120 disables the second AND gate 130 and enables the first AND gate 110 and the PWM controller returns to operating in normal mode.

In this way, the PWM controller of the present invention transitions smoothly between normal mode and green mode in response to heavy load, light load, or no load conditions. As a result, the present invention efficiently reduces power consumption.

Refer to FIG. 3A, which is a timing diagram illustrating waveforms of various signals of a PWM controller during normal mode operation according to an embodiment of the present invention and to FIGS. 3B-3D, which are timing diagrams illustrating waveforms of various signals of a PWM controller during green mode operation according to an embodiment of the present invention.

During normal mode operation, the output of the logic gate (element 110 in FIGS. 1 and 2) is a PWM signal and the output of the ON time releaser (element 150 in FIGS. 1 and 2) is low or a logic zero. The output voltage Vout is a sawtooth signal with a duty cycle equal to or nearly equal to the duty cycle of the PWM driver signal. As shown in FIG. 3A, for heavy load conditions the ON time of the drive signal is greater than light load conditions. As the load lightens the ON time reduces. When the ON time of the signal is shorter than the pulse width threshold, the controller enters green mode. During green mode operation the output of the first logic gate is low since the logic gate is disabled.

In order to clarify detailed operation of the controller of the present invention, the following example is given. It should be noted that the values given in the example are only for clarity. The values can be changed to meet system requirements. For example, the 80% value for the heavy load condition could be 50%, 60%, or other value.

During heavy load as shown in FIG. 3A the ON time or pulse width of the signal could be 80% of the duty cycle. As the load lightens the ON time reduces to, for example, 20%.

Refer to FIG. 3C, when the ON time is less than the pulse width threshold, the controller enters green mode and the ON time measurer begins storing the ON time of the signal. When the total ON time of the signal reaches the total ON time threshold, the ON time releaser outputs a drive signal. The pulse width is a ratio of the ON time threshold. For example, if the ON time of the first pulse in FIG. 3C is 4% and the ON time of the second pulse is 9% and the total ON time threshold is 12%, the ON time releaser can output a signal with an ON time of 12%. The total ON time of the first pulse and second pulse equals 13% which is greater than the total ON time threshold. If the third, fourth, and fifth pulses are each 4% with a total ON time of 12%, the green mode driver can output a pulse with an ON time of 12% after the fifth pulse. The green mode driver will continue operating in this fashion as long as Vout is greater than Vlimit and the pulse width is less than the pulse width threshold.

Refer to FIG. 3B, during green mode the ON time releaser will output a signal if Vout drops below a Vlimit regardless if the total ON time threshold has been reached. If the ON time of the first pulse in FIG. 3B is 2% and the ON time of the second pulse is 4%, the total ON time is 6%. If the total ON time threshold is 10%, the threshold hasn't been reached. However, at the time Vout drops to Vlimit, the ON time releaser will output a pulse signal.

In FIG. 3D the above two green modes are combined. For the first green mode driver output pulse, the total ON time threshold has been reached. For the second green mode driver output pulse, Vout has reached Vlimit.

Due to the reduced switching of the green mode driver signal, power consumption is reduced considerably during green mode operation.

It should be noted that the AND gates illustrated in FIG. 2 can be other types of logic devices.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A pulse width modulation controller comprising:
   a driver for driving circuitry connected to the pulse width modulation controller during normal operation and green mode operation, the driver comprising:
   a pulse width detection circuit for detecting pulse width of a pulse signal; a pulse ON time measuring circuit for storing pulse total ON time, the pulse ON time measuring circuit turning on when the pulse width detection circuit detects pulse width is below a pulse width threshold; and
   a total ON time releaser for outputting the pulse signal to the driving circuitry when output voltage is below a voltage limit or pulse total ON time is above a total ON time threshold, wherein
   the driving circuitry outputs a green mode driver signal.

2. The pulse width modulation controller of claim 1, the green mode driver signal comprising a pulse with an ON time that is a ratio of the total ON time threshold.

3. The pulse width modulation controller of claim 1, the green mode driver signal comprising a pulse with an ON time that is a ratio of the pulse total ON time.

4. A pulse width modulation controller for reducing power consumption comprising:
   a driver circuit comprising:
   a pulse width detection circuit for detecting pulse width of a pulse signal;
   a pulse ON time measuring circuit for storing pulse total ON time when the pulse width detection circuit detects pulse width is below a pulse width threshold;
   an ON time releaser for outputting a green mode driver signal when the pulse ON time measuring circuit detects pulse total ON time is above a total ON time threshold or a voltage level of a feedback signal is below a voltage limit; and
   where the driver circuit outputs a normal mode driver signal when pulse width is above the pulse width threshold.

5. The pulse width modulation controller of claim 4, the green mode driver signal comprising a pulse with an ON time that is a ratio of the total ON time threshold.

6. The pulse width modulation controller of claim 4, the green mode driver signal comprising a pulse with an ON time that is a ratio of the pulse total ON time.

7. A pulse width modulation controller for low power applications comprising:
   a driver for outputting a drive signal, the driver comprising a driver first input, a driver second input, and a driver output;
   a pulse width detection circuit comprising a pulse width detection circuit input for receiving an input signal, a pulse width detection circuit first output, and a pulse width detection circuit second output;
   a first logic device comprising a first logic device first input connected to the pulse width detection circuit input, a first logic device second input connected to the pulse width detection circuit first output, and a first logic device output connected to the driver first input;

a second logic device comprising a second logic device first input connected to the pulse width detection circuit input, a second logic device second input connected to the pulse width detection circuit second output, and a second logic device output;

a pulse ON time measuring circuit for storing pulse total ON time comprising a pulse ON time measuring circuit input connected to the second logic device output and a pulse ON time measuring circuit output;

a second comparator comprising a second comparator positive input for receiving a feedback signal, a second comparator negative input signal for receiving a voltage limit signal, and a second comparator output; and an ON time releaser comprising an ON time releaser first input connected to the pulse ON time measuring circuit output, an ON time releaser second input connected to the second comparator output, and an ON time releaser output connected to the driver second input.

8. The pulse width modulation controller for low power applications of claim 7, further comprising:

an error amplifier comprising an error amplifier positive input for receiving a reference voltage, an error amplifier negative input for receiving the feedback signal, and an error amplifier output; and a first comparator comprising a first comparator negative input connected to the error amplifier output, a first comparator positive input for receiving a sawtooth signal, and a first comparator output connected to the pulse width detection circuit input.

9. The pulse width modulation controller for low power applications of claim 7, the output of the first logic device providing a normal drive signal to the driver during normal operation.

10. The pulse width modulation controller for low power applications of claim 7, the output of the ON time releaser providing a pulse signal to the driver during light load or no load conditions.

11. The pulse width modulation controller for low power applications of claim 7, the first logic device output turning off during light load or no load conditions.

12. The pulse width modulation controller for low power applications of claim 7, the pulse width detection circuit second output turning on during light load or no load conditions.

13. The pulse width modulation controller for low power applications of claim 7, the ON time releaser outputting a pulse with an ON time that is a ratio of a total ON time threshold when total ON time reaches the total ON time threshold.

14. The pulse width modulation controller for low power applications of claim 7, the ON time releaser outputting a pulse with an ON time that is a ratio of the pulse total ON time when the feedback signal is below the voltage limit.

15. A pulse width modulation controller for low power applications comprising:

a driver comprising a driver first input, a driver second input, and a driver output, the driver output providing a drive signal to circuitry connected to the pulse width modulation controller;

an error amplifier comprising an error amplifier positive input for receiving a reference voltage, an error amplifier negative input for receiving a feedback signal, and an error amplifier output;

a first comparator comprising a first comparator negative input connected to the error amplifier output, a first comparator positive input for receiving a sawtooth signal, and a first comparator output;

a pulse width detection circuit comprising a pulse width detection circuit input connected to the first comparator output, a pulse width detection circuit first output, and a pulse width detection circuit second output;

a first logic device comprising a first logic device first input connected to the first comparator output, a first logic device second input connected to the pulse width detection circuit first output, and a first logic device output connected to the driver first input;

a second logic device comprising a second logic device first input connected to the first comparator output, a second logic device second input connected to the pulse width detection circuit second output, and a second logic device output;

a pulse ON time measuring circuit for storing pulse total ON time comprising a pulse ON time measuring circuit input connected to the second logic device output and a pulse ON time measuring circuit output;

a second comparator comprising a second comparator positive input for receiving the feedback signal, a second comparator negative input signal for receiving a voltage limit signal, and a second comparator output; and an ON time releaser comprising an ON time releaser first input connected to the pulse ON time measuring circuit output, an ON time releaser second input connected to the second comparator output, and an ON time releaser output connected to the driver second input.

16. The pulse width modulation controller for low power applications of claim 15, the output of the first logic device providing a normal mode signal to the driver during normal operation.

17. The pulse width modulation controller for low power applications of claim 15, the output of the ON time releaser providing a pulse signal to the driver during light load or no load conditions.

18. The pulse width modulation controller for low power applications of claim 15, the first logic device output turning off during light load or no load conditions.

19. The pulse width modulation controller for low power applications of claim 15, the pulse width detection circuit second output turning on during light load or no load conditions.

20. The pulse width modulation controller for low power applications of claim 15, the ON time releaser outputting a pulse with an ON time that is a ratio of a total ON time threshold when the total ON time reaches the total ON time threshold.

21. The pulse width modulation controller for low power applications of claim 15, the ON time releaser outputting a pulse with an ON time that is a ration of the pulse total ON time when the feedback signal is below the voltage limit.

* * * * *